US012356691B2

(12) United States Patent
Lee et al.

(10) Patent No.: US 12,356,691 B2
(45) Date of Patent: Jul. 8, 2025

(54) SEMICONDUCTOR DEVICE HAVING LOW ON-RESISTANCE AND LOW PARASITIC CAPACITANCE

(71) Applicant: SK keyfoundry Inc., Cheongju-si (KR)

(72) Inventors: Taehoon Lee, Sejong-si (KR); Kwangil Kim, Cheongju-si (KR)

(73) Assignee: SK keyfoundry Inc., Cheongju-si (KR)

( * ) Notice: Subject to any disclaimer, the term of this patent is extended or adjusted under 35 U.S.C. 154(b) by 63 days.

(21) Appl. No.: 17/526,264

(22) Filed: Nov. 15, 2021

(65) Prior Publication Data

US 2022/0344479 A1 Oct. 27, 2022

(30) Foreign Application Priority Data

Apr. 23, 2021 (KR) .................. 10-2021-0053027

(51) Int. Cl.
*H10D 64/00* (2025.01)
*H10D 30/01* (2025.01)
(Continued)

(52) U.S. Cl.
CPC ....... *H10D 64/111* (2025.01); *H10D 30/0221* (2025.01); *H10D 30/0281* (2025.01);
(Continued)

(58) Field of Classification Search
CPC ............. H01L 29/7835; H01L 29/7816; H01L 29/66659; H01L 29/402; H01L 29/66681;
(Continued)

(56) References Cited

U.S. PATENT DOCUMENTS 5,912,490 A * 6/1999 Hebert ................ H01L 29/7801
257/E27.06
7,138,690 B2 11/2006 Xie et al.
(Continued)

FOREIGN PATENT DOCUMENTS

KR 10-2013-0061036 A 6/2013
KR 10-2014-0103836 A 8/2014
(Continued)

OTHER PUBLICATIONS

Korean Office Action issued on Jul. 17, 2022, in counterpart Korean Patent Application No. 10-2021-0053027 (9 pages in Korean).

*Primary Examiner* — David Chen
(74) *Attorney, Agent, or Firm* — NSIP Law

(57) ABSTRACT

A semiconductor device includes a drain region and a source region disposed on a substrate, a gate insulating layer, a gate electrode, a silicide barrier, a source contact plug, a drain contact plug, and a field plate plug. The gate insulating layer, disposed between the drain region and the source region, includes a first gate insulating layer having a first thickness and a second gate insulating layer having a second thickness larger than the first thickness. A bottom surface of the first gate insulating layer and a bottom surface of the second gate insulating layer are parallel to each other. The gate electrode is disposed on the first and second gate insulating layers. The silicide barrier layer is disposed in contact with a top surface of the second gate insulating layer and a top surface of the gate electrode. The source contact plug is connected to the source region.

20 Claims, 16 Drawing Sheets

(51) Int. Cl.
  *H10D 30/65* (2025.01)
  *H10D 62/10* (2025.01)
  *H10D 62/83* (2025.01)
  *H10D 64/62* (2025.01)

(52) U.S. Cl.
  CPC .......... *H10D 30/65* (2025.01); *H10D 62/111* (2025.01); *H10D 62/83* (2025.01); *H10D 64/62* (2025.01)

(58) Field of Classification Search
  CPC .......... H01L 29/42368; H01L 29/1045; H01L 29/665; H01L 29/1095; H01L 29/0634; H01L 29/0696; H01L 29/063; H01L 29/456; H10D 64/111; H10D 30/0221; H10D 30/0281; H10D 30/65; H10D 62/111; H10D 64/62; H10D 30/0229
  USPC ......... 257/335, 339, 409, E21.417, E29.256, 257/E29.261; 438/286, 454
  See application file for complete search history.

(56) References Cited

U.S. PATENT DOCUMENTS

| | | | |
|---|---|---|---|
| 8,664,718 B2 | 3/2014 | Cheng et al. | |
| 9,871,132 B1* | 1/2018 | Liu | H01L 29/7835 |
| 10,566,422 B2 | 2/2020 | Lee et al. | |
| 10,636,904 B2 | 4/2020 | Chou et al. | |
| 10,756,208 B2 | 8/2020 | Lu et al. | |
| 10,777,551 B2 | 9/2020 | Kim et al. | |
| 10,825,905 B2 | 11/2020 | Kuo et al. | |
| 10,964,810 B2 | 3/2021 | Chou et al. | |
| 11,121,253 B2 | 9/2021 | Chung et al. | |
| 11,164,970 B2 | 11/2021 | Ho et al. | |
| 2004/0238913 A1* | 12/2004 | Kwon | H01L 29/42368 |
| | | | 257/E29.066 |
| 2005/0062125 A1* | 3/2005 | Kitaguchi | H10D 62/106 |
| | | | 257/493 |
| 2006/0001104 A1* | 1/2006 | Ookura | H01L 23/53295 |
| | | | 438/296 |
| 2012/0319182 A1* | 12/2012 | Satoh | H01L 29/402 |
| | | | 438/303 |
| 2013/0228868 A1* | 9/2013 | Stribley | H01L 29/7835 |
| | | | 257/E21.632 |
| 2013/0277741 A1 | 10/2013 | Guowei et al. | |
| 2016/0035883 A1* | 2/2016 | Hao | H10D 30/0221 |
| | | | 438/591 |
| 2016/0343853 A1* | 11/2016 | Toh | H01L 29/1095 |
| 2019/0103490 A1* | 4/2019 | Warrick | H01L 29/407 |
| 2019/0172946 A1* | 6/2019 | Wu | H01L 21/28518 |
| 2019/0221666 A1* | 7/2019 | Bang | H01L 29/7835 |
| 2019/0288108 A1* | 9/2019 | Shinohara | H01L 29/7835 |
| 2020/0006550 A1* | 1/2020 | Todd | H01L 21/76224 |
| 2020/0035549 A1* | 1/2020 | Wu | H01L 21/823418 |
| 2021/0036112 A1* | 2/2021 | Xu | H01L 29/66659 |
| 2021/0313420 A1 | 10/2021 | Kim | |
| 2022/0059665 A1* | 2/2022 | Mun | H01L 29/41775 |
| 2022/0093751 A1* | 3/2022 | Tailor | H01L 29/6653 |
| 2022/0336658 A1* | 10/2022 | Cho | H10D 30/65 |

FOREIGN PATENT DOCUMENTS

| | | |
|---|---|---|
| KR | 10-2019-0087786 A | 7/2019 |
| KR | 10-2224364 B1 | 3/2021 |

* cited by examiner

SEMICONDUCTOR DEVICE HAVING LOW ON-RESISTANCE AND LOW PARASITIC CAPACITANCE

CROSS-REFERENCE TO RELATED APPLICATIONS

This application claims the benefit under 35 USC 119(a) of Korean Patent Application No. 10-2021-0053027 filed on Apr. 23, 2021, in the Korean Intellectual Property Office, the entire disclosure of which is incorporated herein by reference for all purposes.

BACKGROUND

1. Field

The following description relates to a semiconductor device having low on-resistance and low parasitic capacitance and manufacturing method thereof.

2. Description of the Related Art

A lateral double-diffused metal oxide semiconductor (LDMOS) transistor is a high voltage power device widely used in various power devices, including a display driver IC, a power converter, a motor controller, and a power source device for a vehicle.

The LDMOS must have a low specific on-resistance and a high breakdown voltage. Also, to improve the switching speed in the LDMOS, a capacitance component is reduced or minimized. A reduced surface field (RESURF) structure may satisfy such conditions which reduces a peak electric field within a drain region.

The RESURF structure connects a field plate plug to a source, so that a high electric field formed in the drain region is reduced and a parasitic capacitance between an on-resistance and a gate-drain is reduced. However, in the RESURF structure, since an accumulation region is not formed in the drift region, a loss of the on-resistance may occur. Also, when the field plate plug is connected to a gate electrode instead of the source electrode to solve such a defect, there occurs a problem that the parasitic capacitance between the gate and the drain increases.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a semiconductor device includes a drain region and a source region disposed on a substrate, a gate insulating layer, a gate electrode, a silicide barrier, a source contact plug, a drain contact plug, and a field plate plug. The gate insulating layer, disposed between the drain region and the source region, includes a first gate insulating layer having a first thickness and a second gate insulating layer having a second thickness larger than the first thickness. A bottom surface of the first gate insulating layer and a bottom surface of the second gate insulating layer are parallel to each other. The gate electrode is disposed on the first and second gate insulating layers. The silicide barrier layer is disposed in contact with a top surface of the second gate insulating layer and a top surface of the gate electrode. The source contact plug is connected to the source region. The drain contact plug is connected to the drain region. The field plate plug is disposed in contact with the silicide barrier layer.

The second gate insulating layer may be disposed closer to the drain region than the first gate insulating layer. A portion of the second thickness of the second gate insulating layer under the silicide barrier layer may be less than another portion of the second thickness of the second gate insulating layer under the gate electrode.

The silicide barrier layer may include a first sub-silicide barrier layer and a second sub-silicide barrier layer made of different materials.

The semiconductor device may further include an etch stop layer disposed on the gate electrode and the silicide barrier layer, an interlayer insulating layer disposed on the etch stop layer, and a metal wiring disposed on the interlayer insulating layer. The second gate insulating layer having the second thickness, the silicide barrier layer, the etch stop layer, and the interlayer insulating layer may be disposed between a drift region and the metal wiring.

The field plate plug may pass through the etch stop layer and the interlayer insulating layer.

The field plate plug may be disposed to vertically overlap or to be vertically spaced apart from the gate electrode.

The drain region may be disposed to overlap the silicide barrier layer.

The semiconductor device may further include a first metal wiring connected to the source contact plug, a second metal wiring connected to the gate electrode, and a third metal wiring connected to the drain contact plug. The field plate plug may be connected to the source region or the gate electrode through the first metal wiring or the second metal wiring.

The semiconductor device may further include a first conductive type buried layer disposed on the substrate, a second conductive type buried layer disposed on the first conductive type buried layer, and a first conductive type drift region and a second conductive type body region disposed on the second conductive type buried layer.

In another general aspect, a semiconductor device includes a first gate electrode and a second gate electrode disposed to be spaced apart from each other on a substrate, a first silicide barrier layer disposed to overlap the first gate electrode, a second silicide barrier layer disposed to overlap the second gate electrode, a drain region disposed between the first and second silicide barrier layers, a first source region disposed on one side of the first gate electrode, a second source region disposed on one side of the second gate electrode, a body region disposed to surround the first and second gate electrodes, a drift region disposed in contact with the body region, and a first field plate plug and a second field plate plug disposed on the first and second silicide barrier layers, respectively.

The first silicide barrier layer may be disposed to surround the first field plate plug. The drift region may be disposed to surround the first and second silicide barrier layers.

The semiconductor device may further include a first pickup region and a second pickup region disposed in the body region, and a deep well region disposed to surround the body region and the drift region.

The semiconductor device may further include a first conductive type ion doped region disposed to overlap the first and second silicide barrier layers.

An area of the first silicide barrier layer not overlapping the first gate electrode may be greater than an area of the first silicide barrier layer overlapping the first gate electrode.

The first gate electrode may be disposed to overlap the drift region, the body region, and the first silicide barrier layer.

On the silicide barrier layer, the field plate plug may be disposed to have a flat plate shape, a stripe shape composed of two or more segments extending perpendicular to a channel length direction, a circular shape, an elliptical shape, or a polygonal shape.

In another general aspect, a semiconductor device includes a drain region and a source region disposed on a substrate, a gate insulating layer, a gate electrode, a silicide barrier layer, and a field plate plug. The gate insulating layer, disposed on the substrate between the drain region and the source region, includes a first gate insulating layer having a first thickness and a second gate insulating layer having a second thickness larger than the first thickness. The gate electrode is disposed on the first gate insulating layer and a portion of the second gate insulating layer. The silicide barrier layer is disposed on a portion of the gate electrode and another portion of the second gate insulating layer. The field plate plug is disposed on the silicide barrier layer to overlap the other portion of the second gate insulating layer.

The field plate plug may further overlap the portion of the gate electrode.

The field plate plug may be vertically unaligned with the portion of the gate electrode.

The field plate plug may include a first field plate plug and a second field plate plug, the first field plate plug may overlap the portion of the gate electrode, and the second field plate plug may be vertically unaligned with the portion of the gate electrode.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
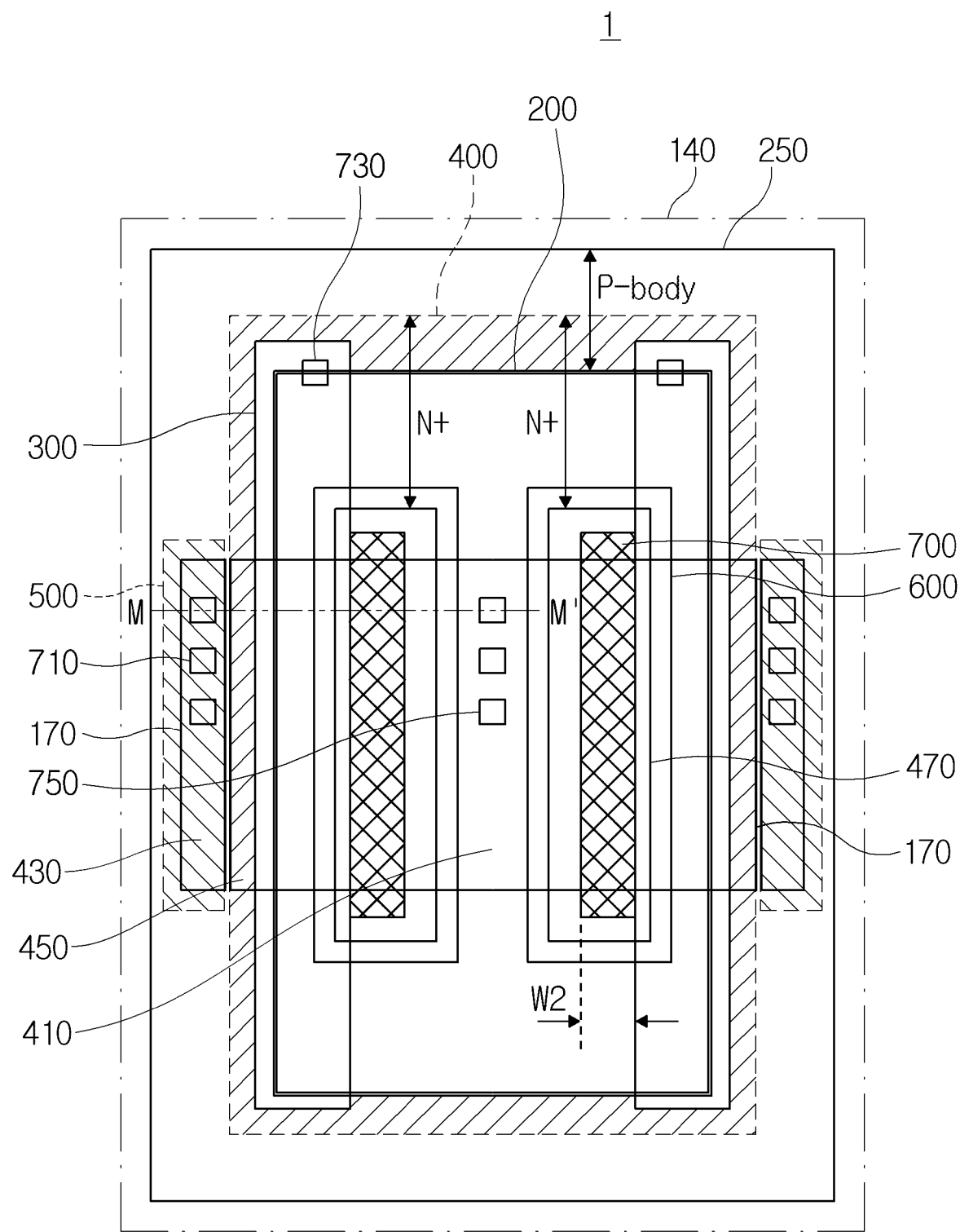
FIG. 1 is a plan view showing a semiconductor device according to one or more embodiments.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after understanding of the disclosure of this application may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there may be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

The purpose of the present disclosure is to provide a semiconductor device capable of reducing an on-resistance and a parasitic capacitance, and a manufacturing method thereof.

The purpose of the present disclosure is to provide a semiconductor device and a manufacturing method thereof. The semiconductor device has a RESURF structure which includes a thin gate insulating layer and a thick gate insulating layer which are formed on a drift region, the thick gate insulating layer being positioned between a gate electrode and a drain region, and a silicide barrier layer and a field plate plug.

FIG. 1 is a plan view showing a semiconductor device according to one or more embodiments of the present disclosure.

Referring to FIG. 1, a semiconductor device 1 may include a second conductive type deep well region (deep P-type well region) (DPW) 140, an active region 170, a first conductive type drift region (N-type drift region) (NDRIFT) 200, a second conductive type body region (P-type body region) 250, a gate electrode 300, a first conductive type high-concentration ion doped region (N+ doped region) 400, a first conductive type drain region (N-type drain region) 410, a second conductive type pickup region 430, a first conductive type source region (N-type source region) 450, a first conductive type high concentration ion implantation blocking region (N+ implantation blocking region) 470, a second conductive type high concentration ion doped region (P+ doped region) 500, a silicide barrier layer 600, a field plate plug 700, a body/source contact plug 710, a gate contact plug 730, and a drain contact plug 750.

In FIG. 1, the semiconductor device 1 includes two or more plural gate electrodes 300. For example, the plural gate electrodes 300 includes the first gate electrode 300 (left) and the second gate electrode 300 (right). The one first conductive type drain region (N-type drain region) 410 is formed between the two gate electrodes 300 (left and right). Alternatively, the drain region 410 is formed between the first and second silicide barrier layers 600 (left and right).

Then, the second conductive type pickup region 430 and the first conductive type source region (N-type source region) 450 are formed at one end of each of the first gate electrode 300 (left side) and the second gate electrode 300 (right side). Thus, in the semiconductor device 1, two second conductive type pickup regions 430 and the first conductive type source region (N-type source region) 450 are formed. For convenience, the source region on the left is the first source region 450 (left), and the source region on the right is the second source region 450 (right). Similarly, the pickup region on the left is the first pickup region 430 (left), and the pickup region on the right is the second pickup region 430 (right).

In FIG. 1, an example is provided in which it is shown in the semiconductor device 1 that source region/gate electrode/drain region/gate electrode/source region. However, the semiconductor device 1 may be formed in an array in which such a structure is repeated.

Also, the semiconductor device 1 includes a plurality of the silicide barrier layers 600. The plurality of silicide barrier layers 600 includes the first silicide barrier layer 600 (left) and the second silicide barrier layer 600 (right). The first silicide barrier layer 600 is formed to overlap a portion of the first gate electrode 300. The second silicide barrier layer 600 is formed to overlap a portion of the second gate electrode 300.

The first and second silicide barrier layers 600 (left and right) may also be referred to as non-sal layer 600. The silicide barrier layer 600 is an insulating layer that is formed to prevent silicide formation. Therefore, silicide is allowed to be formed in the remaining region. For example, silicide is formed in the active region 170 and the gate electrode 300 other than the silicide barrier layer 600.

Here, the silicide barrier layer 600 has a structure that completely surrounds the field plate plug 700 and the first conductive type high concentration ion implantation blocking region (N+ implantation blocking region) 470. Thus, the area of the silicide barrier layer 600 is greater than the area occupied by the field plate plug 700.

Also, the silicide barrier layer 600 is formed to overlap a portion of the gate electrode 300. The area of the silicide barrier layer 600 that does not overlap the gate electrode 300 is much greater than the area of the silicide barrier layer 600 that overlaps the gate electrode 300.

The first conductive type drift region (N-type drift region) (NDRIFT) 200 is doped at a lower concentration than that of the drain region 410 to increase a breakdown voltage between the source and the drain. The first conductive type drift region (N-type drift region) (NDRIFT) 200 is formed completely surrounding the first conductive type drain region (N-type drain region) 410, the silicide barrier layer 600, and the field plate plug 700. The first conductive type drift region (N-type drift region) (NDRIFT) 200 is formed to partially overlap the gate electrode 300.

The second conductive type body region (P-type body region) 250 forms a channel, and is formed to surround the two gate electrodes 300 and in contact with the first conductive type drift region (N-type drift region) (NDRIFT) 200. Also, the second conductive type body region (P-type body region) 250 is formed to overlap the first conductive type high-concentration ion doped region (N+ doped region) 400. Also, the second conductive type body region (P-type body region) 250 is formed to overlap the two second conductive type pickup regions 430 and the two first conductive type source regions (N-type source region) 450.

To form the first conductive type drain region (N-type drain region) 410 and the first conductive type source region (N-type source region) 450, a first conductive type dopant is ion-implanted into the first conductive type high-concentration ion doped region (N+ doped region) 400. Here, the first conductive type drain region (N-type drain region) 410 is designed to be formed slightly more inward than the silicide barrier layer 600 (see FIG. 2). That is, with respect to the gate electrode 300, one end of the first conductive type drain region (N-type drain region) 410 is formed to extend further to the gate electrode 300 than one end of the silicide barrier layer 600 (see FIG. 2). Therefore, the drain region 410 is formed to overlap the first and second silicide barrier layers 600 (left and right), respectively.

There exists the first conductive type high concentration ion implantation blocking region (N+ implantation blocking region) 470. This intends to adjust the length of the first conductive type drain region (N-type drain region) 410. For example, for the purpose of increasing resistance between the gate electrode 300 and the first conductive type drain region (N-type drain region) 410, it is possible to design such that a first conductive type high concentration ion is not implanted into a specific region between the gate electrode 300 and the first conductive type drain region (N-type drain region) 410.

The second conductive type high concentration ion doped region (P+ doped region) 500 is required for forming the second conductive type pickup region 430.

In FIG. 1, the second conductive type deep P-type well region (DPW) 140 has a structure that surrounds all the first conductive type drift region (N-type drift region) (NDRIFT) 200, the second conductive type body region (P-type body region) 250, the gate electrode 300, the silicide barrier layer 600, the field plate plug 700, the body/source contact plug 710, the gate contact plug 730, and the drain contact plug 750.

The active region 170 excludes an isolation region (not shown), and may form the first conductive type drain region (N-type drain region) 410, the second conductive type pickup region 430, and the first conductive type source region (N-type source region) 450.

In FIG. 1, the semiconductor component 1 includes two or more plural field plate plugs 700. The plural field plate plugs 700 may include the first field plate plug 700 (left) positioned on the left and the second field plate plug 700 (right) disposed the right. The plural field plate plugs 700 are formed in order to reduce the surface electric field (RESURF) between the gate electrode 300 and the drain region 410. Although the field plate plug is shown to have a rectangular shape in FIG. 1, the field plate plug may have various pattern shapes depending on purposes. The first field plate plug 700 (left) positioned on the left and the second field plate plugs 700 (right) positioned on the right may be formed on the first and second silicide barrier layers, respectively. Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

The body/source contact plug 710 is formed to be electrically connected to the second conductive type pickup region 430 and the first conductive type source region (N-type source region) 450. Silicides are formed on the second conductive type pickup region 430 and the first conductive type source region (N-type source region) 450 so that electrically the same voltage is applied to the second conductive type pickup region 430 and the first conductive type source region (N-type source region) 450 through the silicides.

The gate contact plug 730 is electrically connected to the gate electrode 300. Also, the drain contact plug 750 is electrically connected to the first conductive type drain region (N-type drain region) 410.

Figure 2:
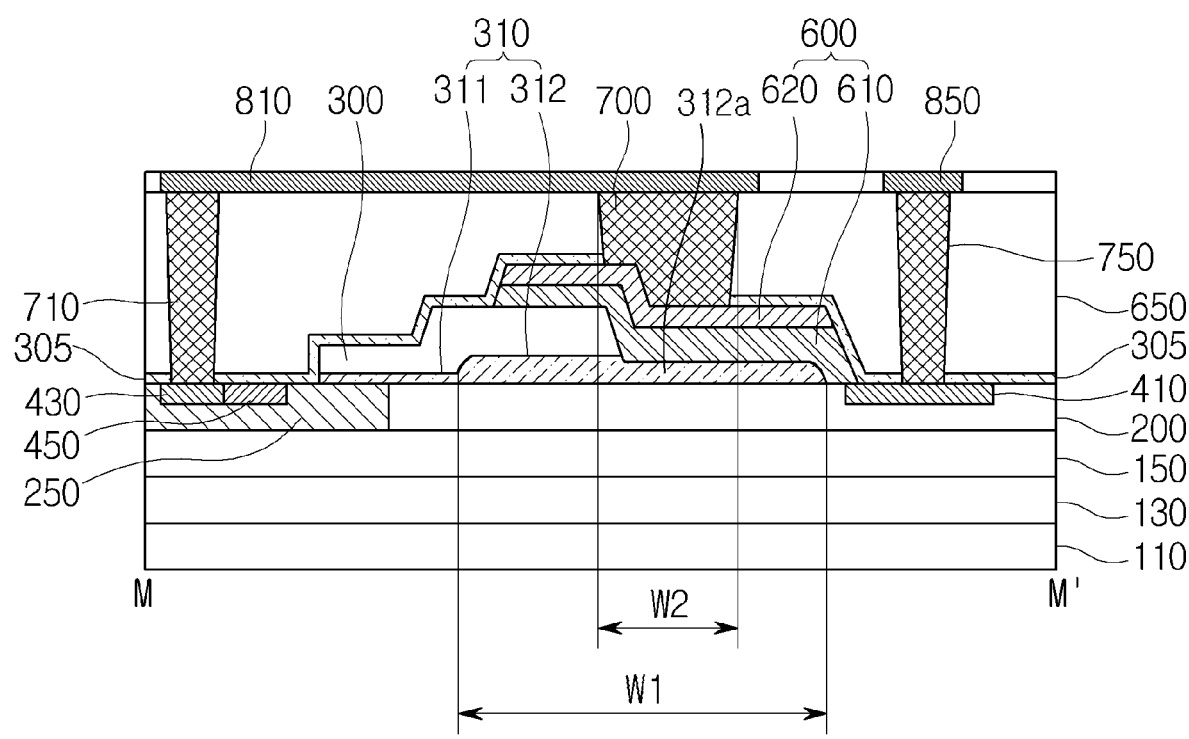
FIG. 2 is a cross-sectional view taken along line M-M' of FIG. 1, according to one or more embodiments.

FIG. 2 is a cross-sectional view taken along line M-M' of FIG. 1, according to one or more embodiments.

Referring to FIG. 2, the semiconductor device 1 includes a substrate 110, a first conductive type buried layer (N-type buried layer, NBL) 130, and the second conductive type deep P-type well region (DPW) 140 (not shown), a second conductive type buried layer (P-type buried layer, PBL) 150, the first conductive type drift region (N-type drift region) (NDRIFT) 200, the second conductive type body region (P-type body region) 250, the gate electrode 300, a gate insulating layer 310, the first conductive type drain region (N-type drain region) 410, the second conductive type pickup region 430, the first conductive type source region (N-type source region) 450, the silicide barrier layer 600, an interlayer insulating layer 650, the field plate plug 700, the body/source contact plug 710, the gate contact plug 730 (not shown), the drain contact plug 750, and metal wirings 810 and 850.

The substrate 110 may be an epi-layer or a silicon substrate. For example, the substrate 110 may be a P-type silicon substrate. The first conductive type buried layer 130 and second conductive type buried layer 150 may be sequentially disposed on the substrate 110. For example, the first conductive type buried layer 130 may be doped with high concentration N-type impurities, and the second conductive type buried layer 150 may be doped with high concentration P-type impurities.

The first conductive type buried layer 130 and the second conductive type buried layer 150 may be used for fully isolated MOS devices in a high voltage device. As the first conductive type buried layer 130 and the second conductive type buried layer 150 are disposed on the substrate 110, noise due to the switching of the high voltage device may be reduced, thereby reducing leakage current. Also, the second conductive type buried layer 150 doped with the P-type impurity is disposed under the first conductive type drift region 200 described later. As a result, the doping concentration of the first conductive type drift region 200 may be increased. Also, in a reverse bias state, the depletion area may increase greatly. The larger the area of the depletion region, the higher the breakdown voltage may be maintained.

The first conductive type drift region 200 and the second conductive type body region 250 may be disposed on the second conductive type buried layer 150. For example, the first conductive type drift region 200 may be doped with N-type impurities, and the second conductive type body region 250 may be doped with P-type impurities. The first conductive type drift region 200 may be formed to improve the breakdown voltage of the semiconductor device 1. According to a principle that the breakdown voltage is increased when the impurity doping concentration is low in a PN junction, the first conductive type drift region 200 doped at a low concentration may improve the withstand voltage performance of the semiconductor device 1. The second conductive type body region 250 may be a channel region doped with P-type impurities at a low concentration. The second conductive type body region 250 may be a region in which a channel between the source and the drain is formed.

The gate electrode 300 may be disposed on the first conductive type drift region 200 and the second conductive type body region 250. The gate electrode 300 may be made of polysilicon (Poly-Si).

A gate insulating layer 310 may be positioned between the gate electrode 300 and the first conductive type drift region 200, and it may be also disposed between the gate electrode 300 and the second conductive type body region 250. The gate insulating layer 310 may be made of a material such as a silicon oxide film (SiO2) or a silicon nitride film (Sign), SiON, or the like.

In various embodiments of the present disclosure, the gate insulating layer 310 includes a first gate insulating layer 311 and a second gate insulating layer 312 extending from one end of the first gate insulating layer 311. The bottom surfaces of the first gate insulating layer 311 and the second gate insulating layer 312 are coplanar. The first gate insulating layer 311 may be disposed on the second conductive type body region 250 and the first conductive type drift region 200. The second gate insulating layer 312 may be disposed on the first conductive type drift region 200. That is, the second gate insulating layer 312 is disposed closer to the drain region than the first gate insulating layer 311.

Here, the thickness of the second gate insulating layer 312 is greater than that of the first gate insulating layer 311. For example, the first gate insulating layer 311 may have a thickness of about 6 nm to 20 nm, and the second gate insulating layer 312 may have a thickness of about 20 nm to 100 nm. As the thick second gate insulating layer 312 exists between the gate electrode 300 and the drain region 410, a parasitic capacitance between the gate electrode 300 and the drain region 410 may be reduced, and a switching speed of the semiconductor device 1 may be increased.

In such an embodiment, a width length W1 of the second gate insulating layer 312 is greater than a width length W2 of the field plate plug 700 described below. The second gate insulating layer 312 is spaced apart from the first conductive type drain region 410. A silicide barrier layer 600 is disposed between the second gate insulating layer 312 and the first conductive type drain region 410. The width length W1 of the second gate insulating layer 312 may be, for example, 20 nm to 60 nm.

In such an embodiment, in the second gate insulating layers 312 and 312a, the thickness of the second gate insulating layer 312a positioned under the silicide barrier layer 600 may be slightly less than the thickness of the second gate insulating layer 312 positioned under the gate electrode 310. One end of the second gate insulating layer 312 in contact with the first gate insulating layer 311 may be smoothly formed. For example, the one end may have a region of which the surface is curved or tapered. The width length of the smoothly formed region may be, for example, 10 nm to 50 nm. An interior angle (e.g., a taper angle) between the bottom surface and the surface of the one end may be determined in response to the thickness of the second gate insulating layer 312.

The gate electrode 300 may be disposed on the first gate insulating layer 311 of the gate insulating layer 310 and on at least one region of the second gate insulating layer 312 of the gate insulating layer 310.

The first conductive type drain region 410 may be disposed in the first conductive type drift region 200. For example, the first conductive type drain region 410 may be doped with N-type impurities.

The first conductive type source region 450 may be disposed in the second conductive type body region 250. For example, the first conductive type source region 450 may be doped with N-type impurities. When voltages are applied to each of the first conductive type drain region 410 and the gate electrode 300, a channel may be formed in the second conductive type body region 250 that is disposed between the first conductive type source region 450 and the gate electrode 300.

The second conductive type pickup region 430 may be provided to the second conductive type body region 250, which is disposed adjacent to the first conductive type source region 450. For example, the second conductive type pickup region 430 may be doped with P-type impurities.

The silicide barrier layer 600 may be disposed on the first conductive type drift region 200, the gate electrode 300, and a portion of the second gate insulating layer 312 of the gate insulating layer 310. The silicide barrier layer 600 may be provided to extend over the first conductive type drift region 200 and a portion of the top surface of the first conductive type drain region 410.

The silicide barrier layer 600 may be made of a silicon oxide film (SiO2), a silicon nitride film (sin), SiON, or a low-k dielectric material having a low dielectric constant. The thickness of the silicide barrier layer 600 may be controlled based on a breakdown voltage required for the semiconductor device 1. The silicide barrier layer 600 may comprise a single layer or multilayer. For example, the silicide barrier layer 600 may comprise first and second insulating layers 610 and 620 which are formed from different materials. Therefore, a plurality of insulating layers may be used as the silicide barrier layer 600. The silicide barrier layer 600 may comprise a first sub-silicide barrier layer 610 and a second sub-silicide barrier layer 620. Here, the first sub-silicide barrier layer 610 is an oxide film, and the second sub-silicide barrier layer 620 may be a nitride film.

An etch stop layer 305 may be provided on the top surface of the gate electrode 300 and on the top surface of the silicide barrier layer 600. The etch stop layer 305 is required when the plurality of contact plugs 700, 710, 730, and 750 are formed. The etch stop layer 305 may be formed of a silicon nitride film or a silicon oxide-nitride film (SiON). Such an etch stop layer 305 may be formed by an LPCVD or PECVD method. The etch stop layer 305 may be formed on the first conductive type source region 450, the second conductive type pickup region 430, the gate electrode 300, the silicide barrier layer 600, and the first conductive type drain region 410.

The interlayer insulating layer 650 may be disposed on the etch stop layer 305. The interlayer insulating layer 650 may be made of silicon oxide layer (SiO2) or a material such as USG, TEOS, BPSG, PSG, or the like. Thus, the second gate insulating layer 312 and 312a having a second thickness, the first sub-silicide barrier layer 610, the second sub-silicide barrier layer 620, the etch stop layer 305, and the interlayer insulating layer 650 may be formed between the drift region 200 and the metal wirings 810 and 850. Alternatively, the second gate insulating layer 312 and 312a having the second thickness, the first sub-silicide barrier layer 610, and the second sub-silicide barrier layer 620 may be formed between the drift region 200 and the field plate plug 700.

The field plate plug 700 may be provided to pass through the interlayer insulating layer 650 and the etch stop layer 305. The field plate plug 700 may be disposed on and in contact with the silicide barrier layer 600. In this embodiment, the field plate plug 700 is disposed such that at least one region of the field plate plug 700 vertically overlaps the gate electrode 300. In another embodiment, however, the field plate plug 700 is disposed so as not to vertically overlap the gate electrode 300. These embodiments are shown below in FIGS. 3 and 4.

In a top view, the field plate plug 700 may be provided in the form of a plate on the silicide barrier layer 600. The field plate plug 700 may vertically overlap the second conductive type buried layer 150. For example, the field plate plug 700 may be made of a conductive material such as polysilicon or a metal such as tungsten, Al, Cu, etc.

A high electric field concentrated on the surface of the substrate between the gate electrode 300 and the drain region 410 may be reduced through the field plate plug 700. That is, the field plate plug 700 allows the electric field to be distributed uniformly without being concentrated in one place. Thus, by providing the field plate plug 700, the breakdown voltage of the semiconductor device 1 may be increased. A ground voltage may be basically applied to the field plate plug 700.

The plurality of contact plugs 710, 730, and 750 may be provided to pass through the interlayer insulating layer 650 and the etch stop layer 305. For example, the plurality of contact plugs 710, 730, and 750 may be made of a conductive material. The plurality of contact plugs 710, 730, and 750 may include the source contact plug 710 connected to the first conductive type source region 450, the gate contact plug 730 connected to the gate electrode 300, and the drain contact plug 750 connected to the first conductive type drain region 410. A plurality of the source contact plug 710, a plurality of the gate contact plug 730, and a plurality of the drain contact plug 750 may be provided. Here, the source contact plug 710, the gate contact plug 730, and the drain contact plug 750 may be formed simultaneously in a contact plug process step.

In an example, in one semiconductor device 1, the plurality of source contact plugs 710, the plurality of gate contact plugs 730, and the plurality of drain contact plugs 750 may be provided respectively, and one field plate plug 700 may be provided. In a top view, the area of the field plate plug 700 may be greater than the sum of the areas of the plurality of source contact plugs 710. Further, the area of the field plate plug 700 may be greater than a sum of the areas of the plurality of gate contact plugs 730. Alternatively, the area of the field plate plug 700 may be greater than a sum of the areas of the plurality of drain contact plugs 750.

The width length W2 for the channel length direction of the field plate plug 700 may be greater than the width length of each of the source contact plug 710 and the drain contact plug 750. For example, the width length W2 of the field plate plug 700 may be about 2 to 10 times greater than the width length of each of the source contact plug 710 or the drain contact plug 750. The greater the width length W2 of the field plate plug 700, the greater the electric field reduction effect.

The source contact plug 710 may be connected to the first metal wiring 810, the gate contact plug 730 may be connected to the second metal wiring (not shown), and the drain contact plug 750 may be connected to the third metal wiring 850. In an example, the field plate plug 700 is in contact with and electrically connected to the first metal wiring 810. Accordingly, the field plate plug 700 may be electrically connected to the source contact plug 710 and the first conductive type source region 450 through the first metal wiring 810. The field plate plug 700 and the first conductive type source region 450 are electrically connected to each other.

Figure 3:
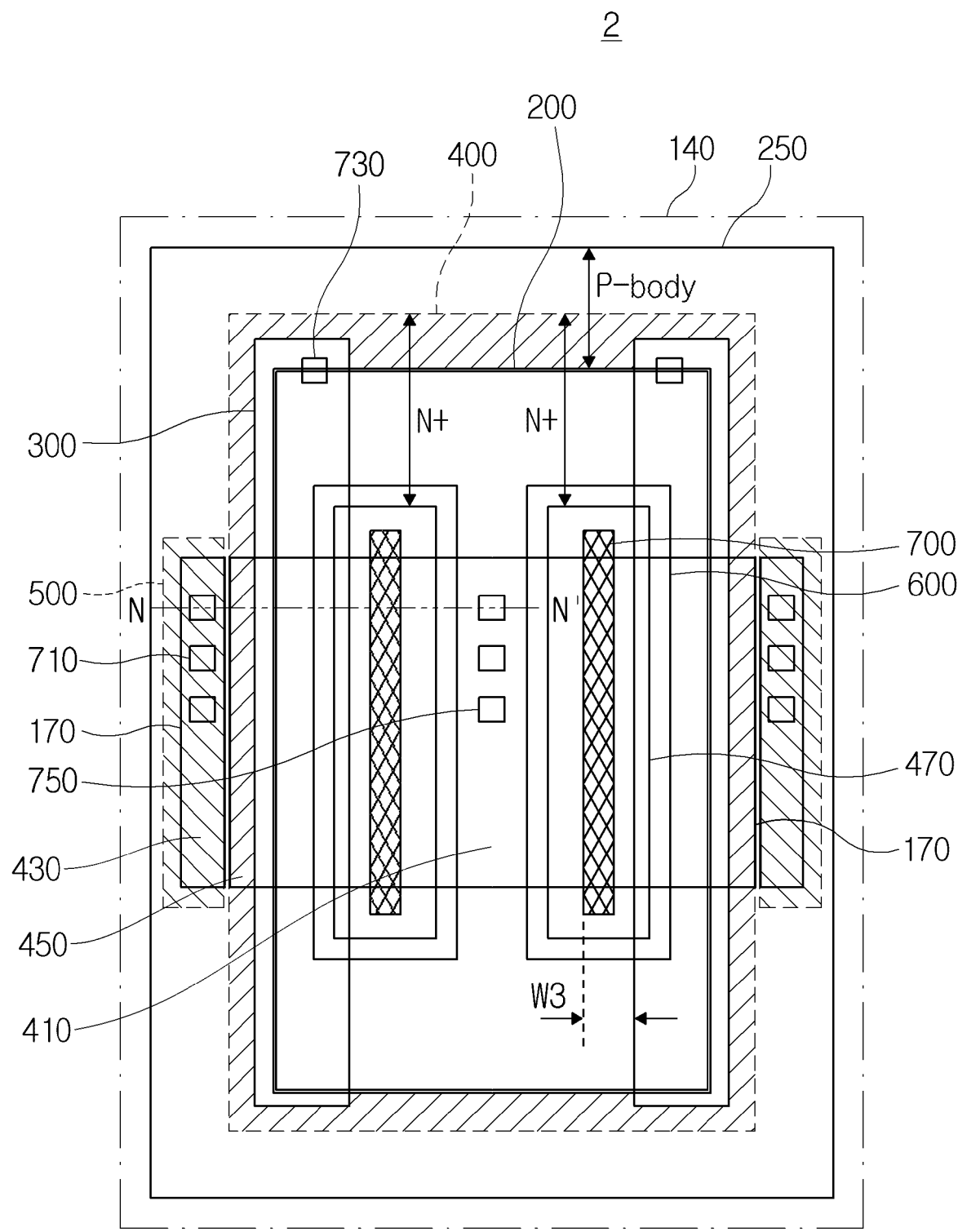
FIG. 3 is a plan view showing a semiconductor device according to one or more embodiments.
Figure 4:
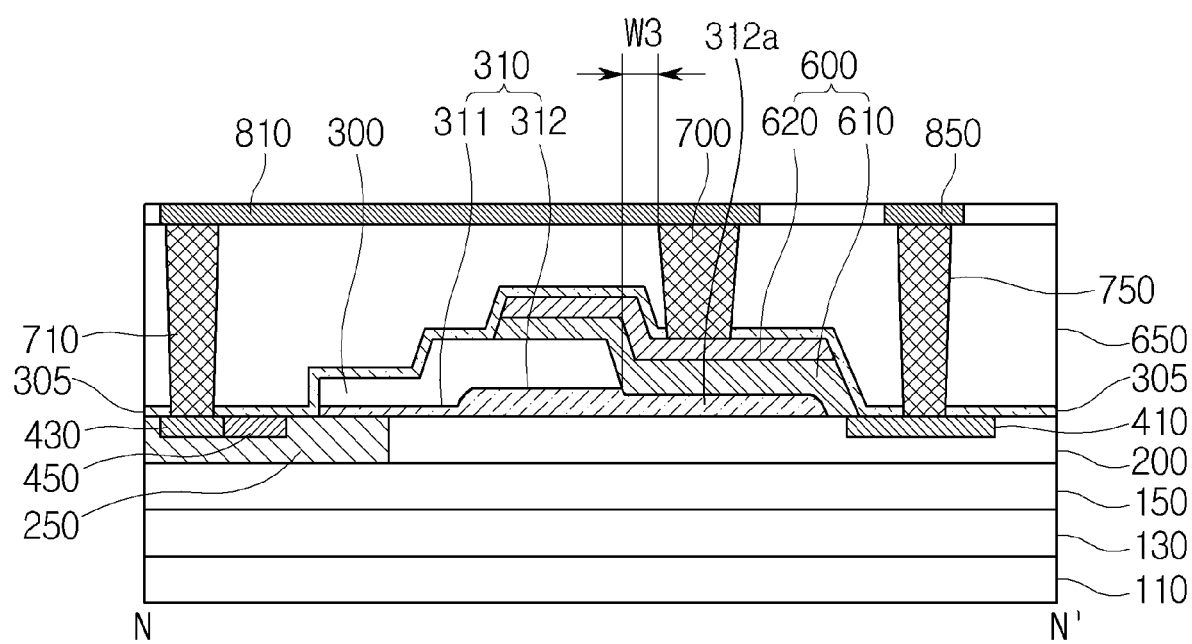
FIG. 4 is a cross-sectional view taken along line N-N' of FIG. 3, according to one or more embodiments.

FIG. 3 is a plan view showing a semiconductor device according to one or more embodiments. FIG. 4 is a cross-sectional view taken along line N-N' of FIG. 3, according to one or more embodiments.

As shown in FIG. 2, the field plate plug 700 is disposed to vertically overlap the gate electrode 300. In contrast, in the examples shown in FIGS. 3 and 4, the field plate plug 700 is disposed so as not to vertically overlap the gate electrode 300. Here, a separation distance W3 between the field plate plug 700 and the gate electrode 300 may be, for example, 0 nm to 300 nm. As the field plate plug 700 is placed close to the first conductive type drain region 410, the RESURF effect may be increased.

In such an embodiment, the silicide barrier layer 600 may comprise a single layer or multilayer. For example, as shown in FIG. 4, the silicide barrier layer 600 may comprise the first sub-silicide barrier layer 610 and the second sub-silicide barrier layer 620. Here, the first sub-silicide barrier layer 610 is an oxide film, and the second sub-silicide barrier layer 620 may be a oxide film formed from Tetraethyl orthosilicate (TEOS) precursor. Therefore, both the first sub-silicide barrier layer 610 and the second sub-silicide barrier layer 620 may be formed of the same oxide film.

Figure 5:
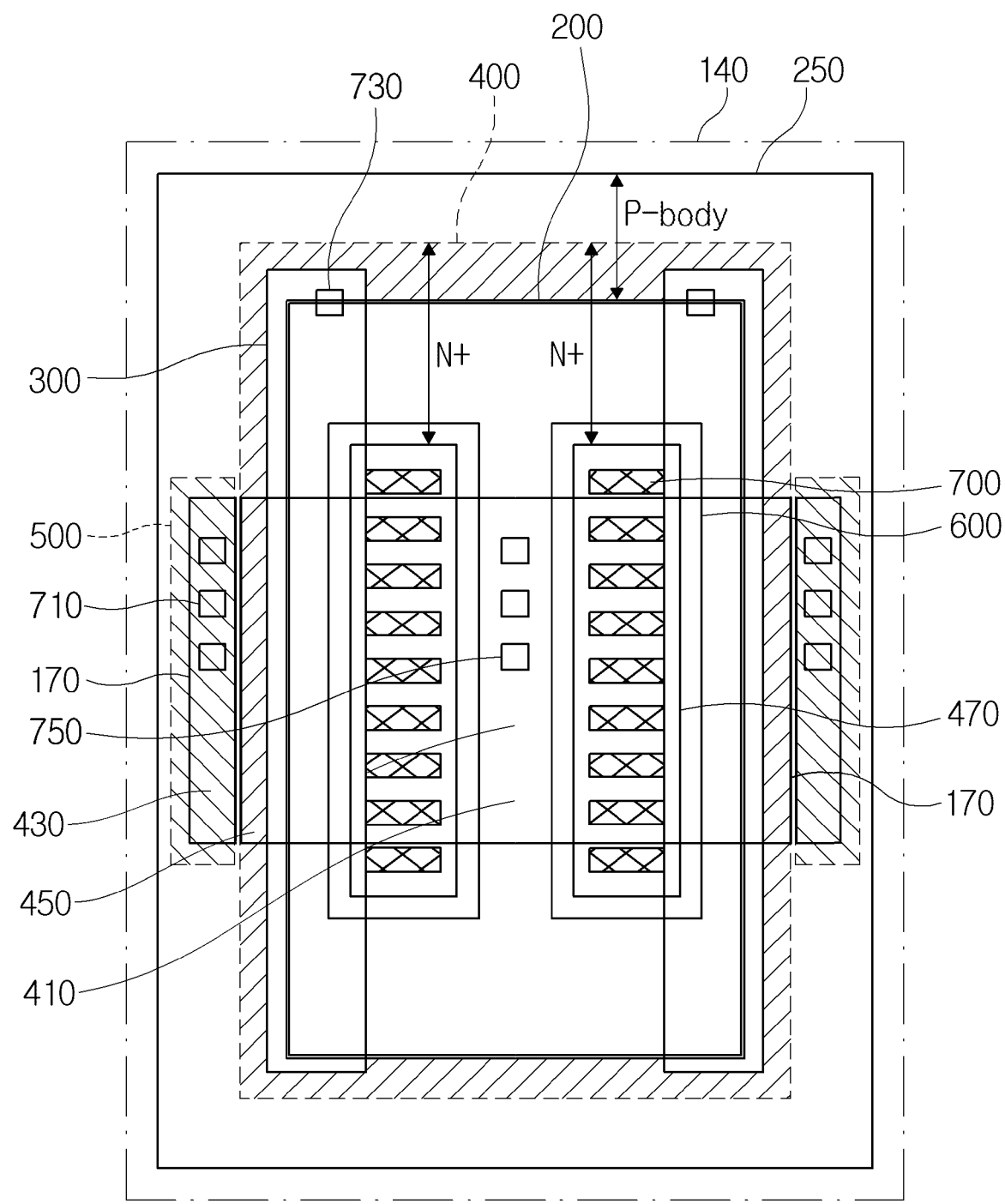
FIG. 5 is a plan view showing a semiconductor device according to one or more embodiments.

FIG. 5 is a plan view showing a semiconductor device according to one or more embodiments of the present disclosure.

In an example, the field plate plug 700 of a semiconductor device 3 may be provided in the form of a wide stripe on the silicide barrier layer 600 in a top view. Each field plate plug 700 may comprise a plurality of segments that extend in the channel length direction. Each segment may be provided to pass through the interlayer insulating layer (see reference numeral 650 in FIG. 2) and the etch stop layer 305. Each segment may be disposed on and in contact with the silicide barrier layer 600. Each segment may be disposed to vertically overlap the gate electrode 300 as in an example of FIG. 2, or may be disposed so as not to vertically overlap the gate electrode 300 as in an example of FIG. 4.

Figure 6:
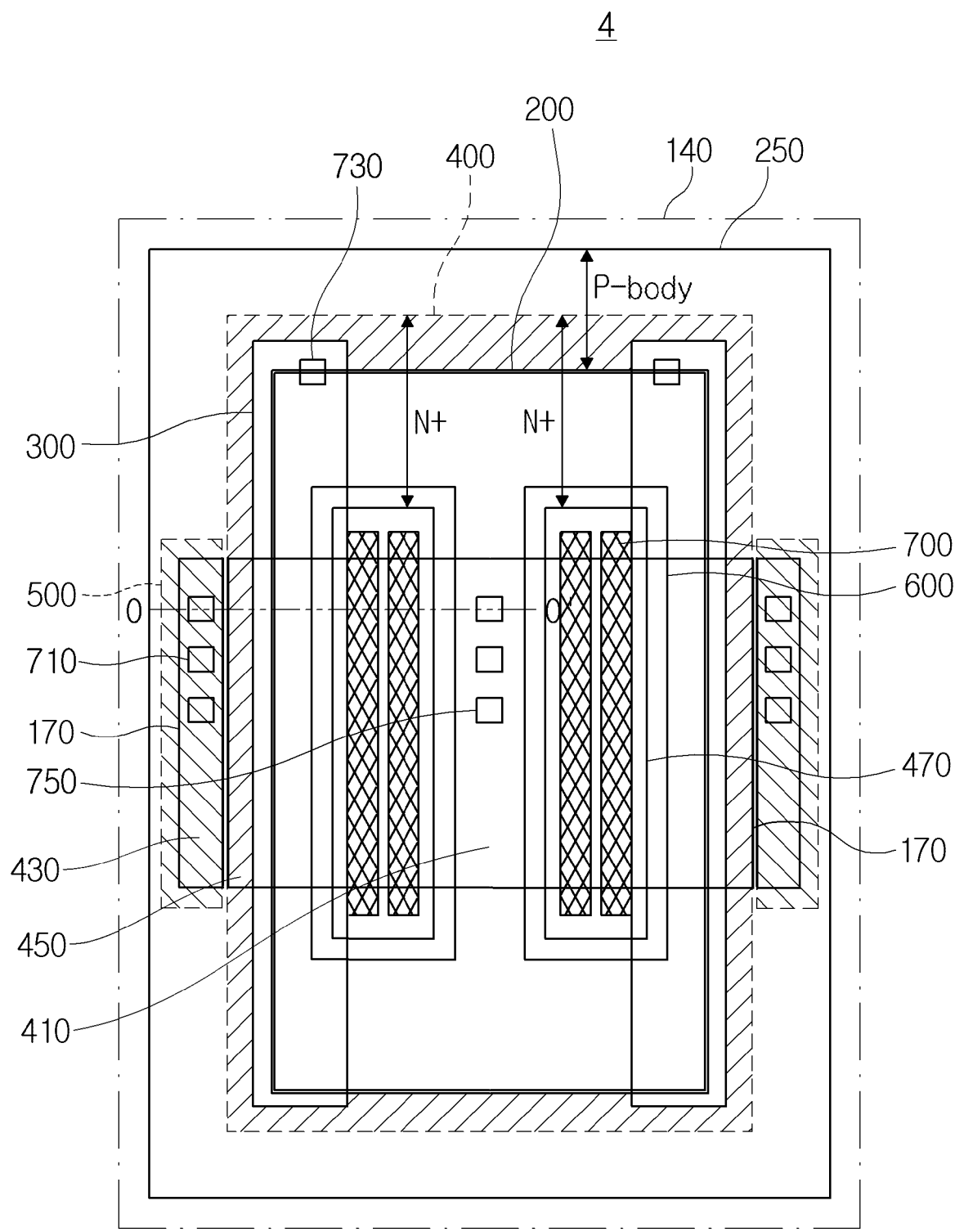
FIG. 6 is a plan view showing a semiconductor device according to one or more embodiments.
Figure 7:
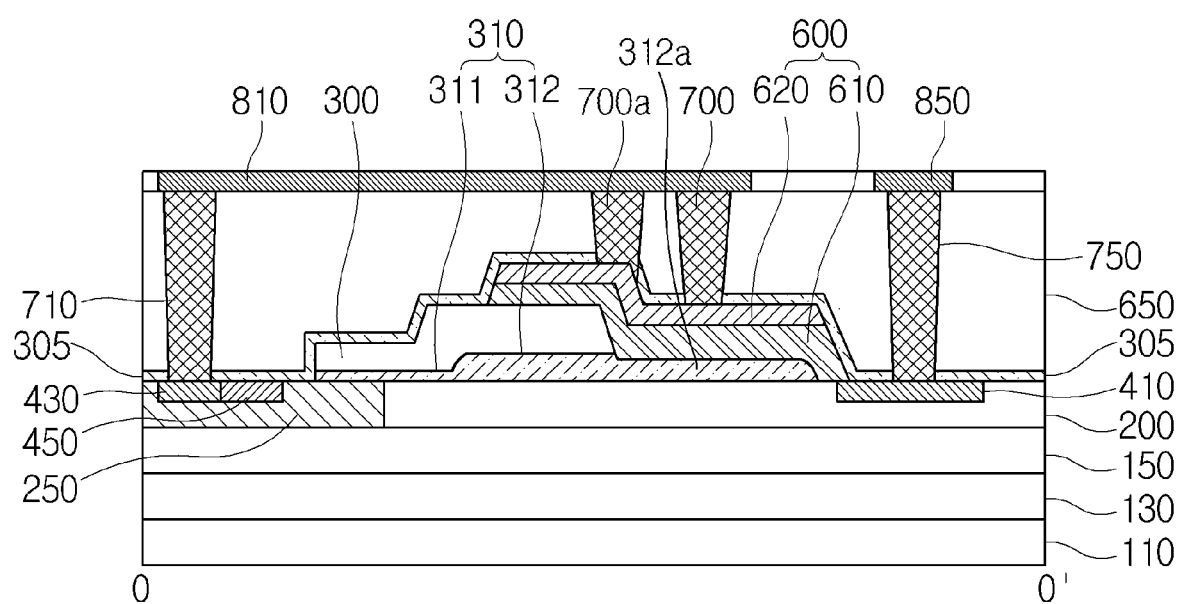
FIG. 7 shows an example of a cross-sectional view taken along line O-O' of FIG. 6, according to one or more embodiments.
Figure 8:
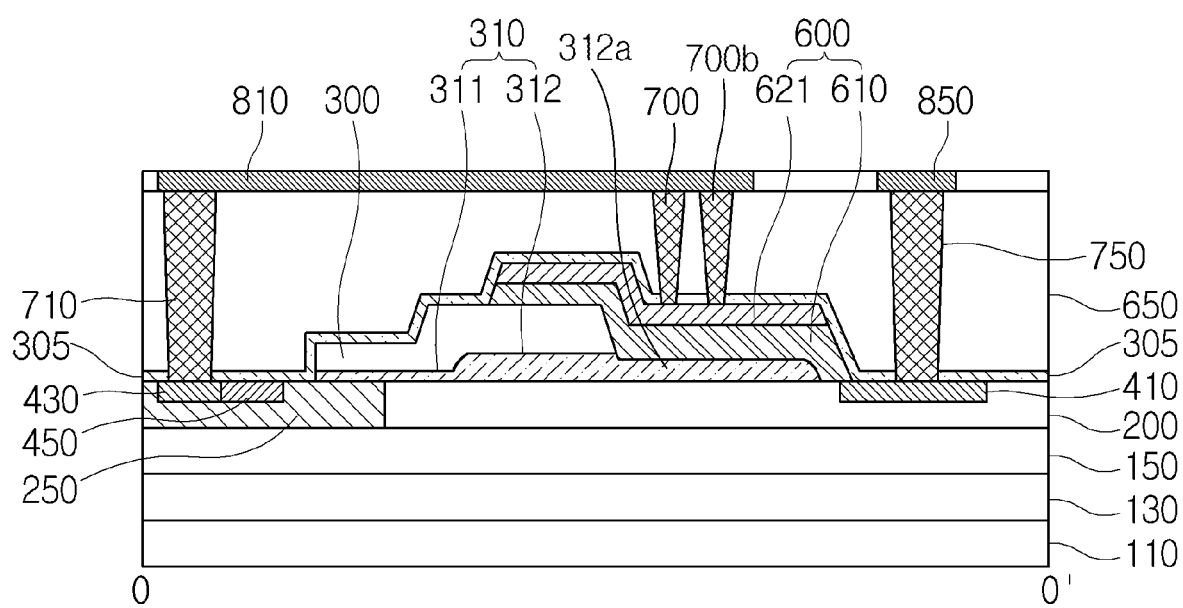
FIG. 8 shows an example of the cross-sectional view taken along line O-O' of FIG. 6, according to one or more embodiments.

FIG. 6 is a plan view showing a semiconductor device 4 according to one or more embodiments of the present disclosure. FIG. 7 shows an example of a cross sectional view taken along line O-O' of FIG. 6, according to one or more embodiments. FIG. 8 shows an example of the cross-sectional view taken along line O-O' of FIG. 6, according to one or more embodiments.

In an example, as shown in FIG. 6, the field plate plug 700 of a semiconductor device 4 may be provided in the form of a wide stripe on the silicide barrier layer 600 in a top view. That is, each field plate plug 700 may comprise a plurality of segments that extend in a Y-axis direction perpendicular to the channel length direction (X-axis). FIG. 6 shows a dual field plate structure in which each of the field plate plugs 700 comprises two segments that extend in the Y-axis direction perpendicular to the channel length direction (X-axis). The widths of the segments in the channel length direction may be the same or different.

Each of the field plate plugs 700, 700a, and 700b may be disposed on and in contact with the silicide barrier layer 600. In an example, as shown in FIG. 7, the first field plate plug 700a may overlap the gate electrode 300, and the second field plate plug 700 may be spaced apart from the gate electrode 300. Alternatively, as shown in FIG. 8, both the field plate plugs 700 and 700b may be spaced apart from the gate electrode 300.

In this embodiment, the field plate plug 700 is configured in the form of a stripe, so that the on-resistance and the parasitic capacitance are further reduced.

Figure 9:
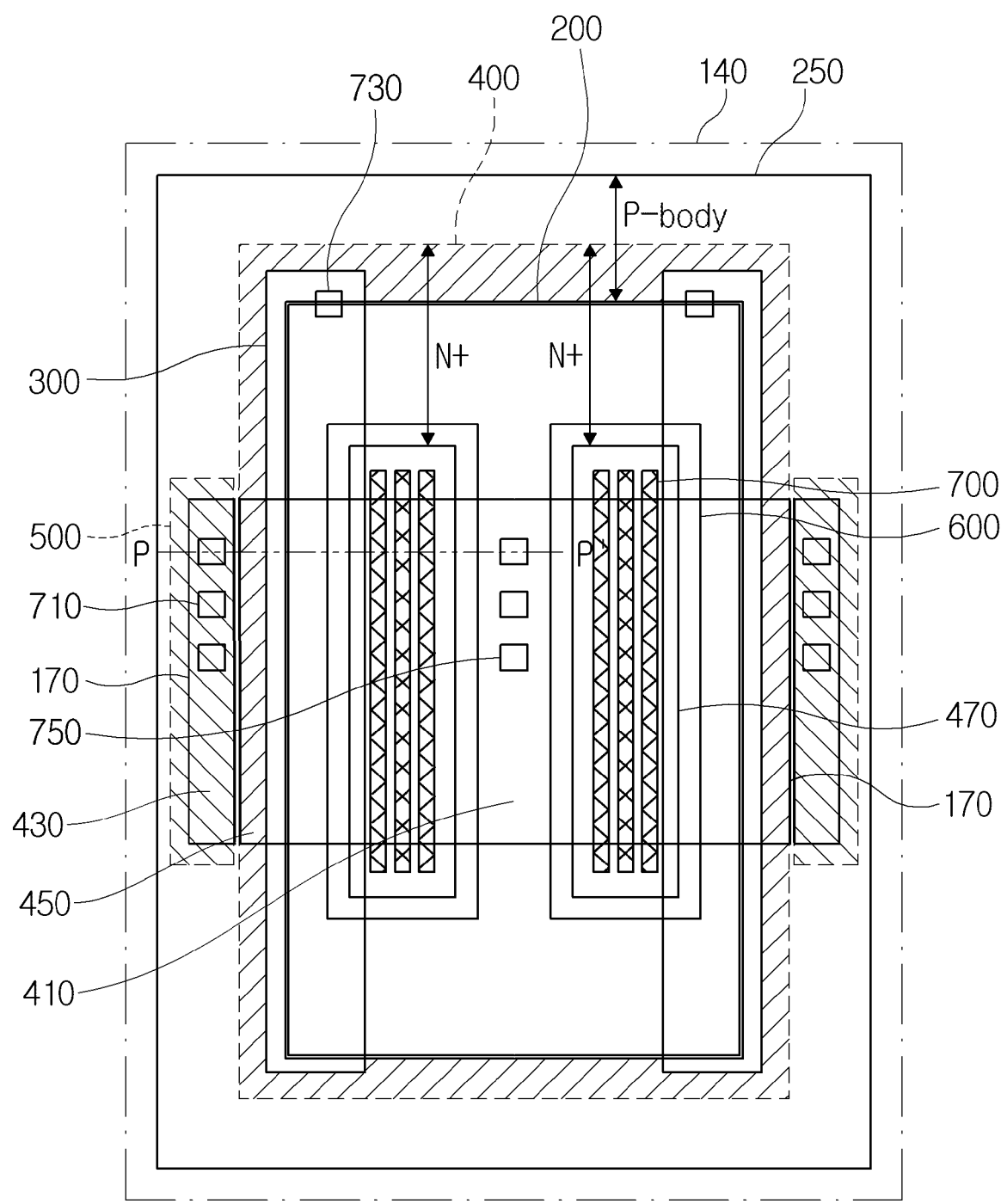
FIGS. 9 and 10 are plan views showing a semiconductor device according to one or more embodiments.
Figure 10:
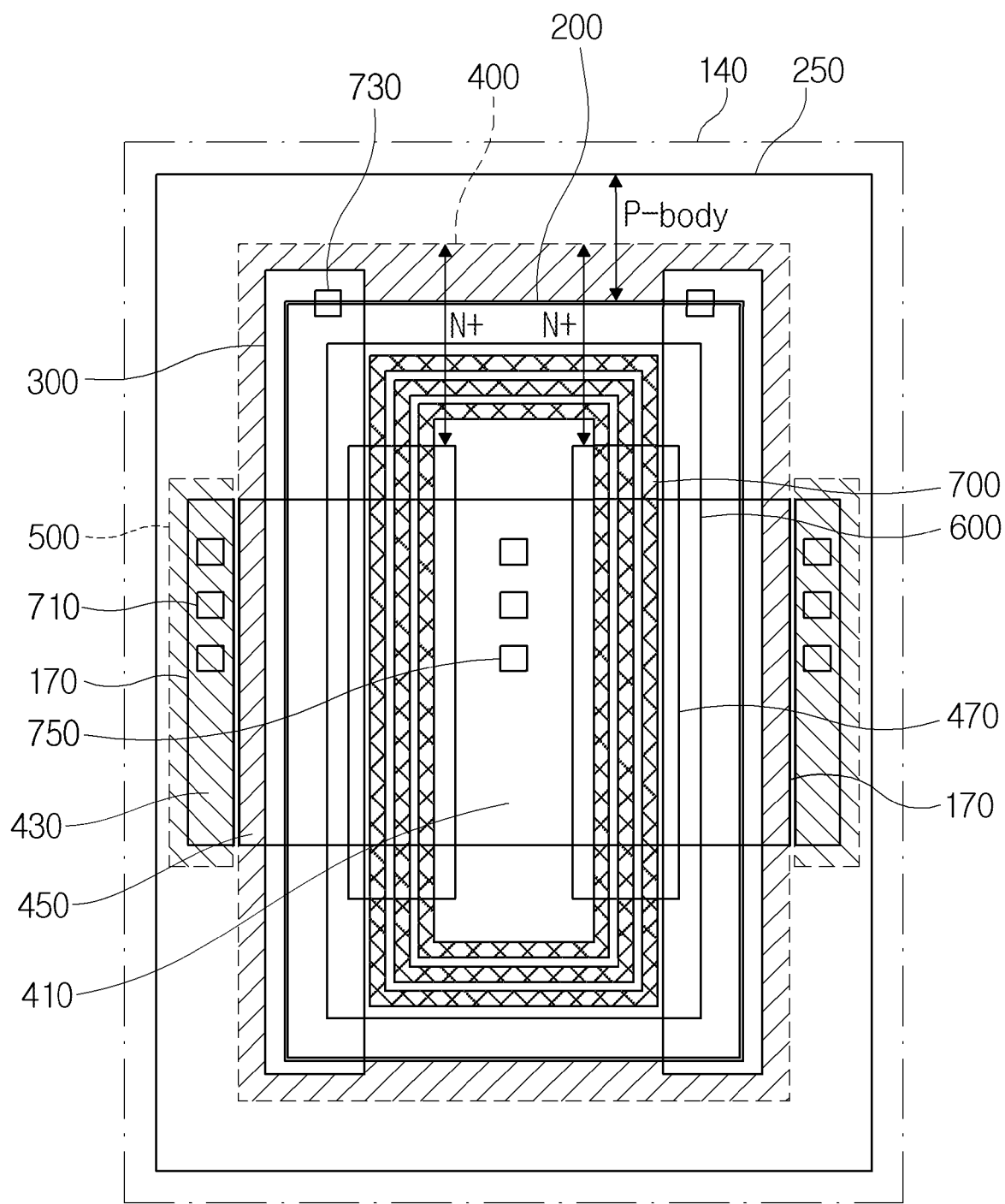
Figure 11:
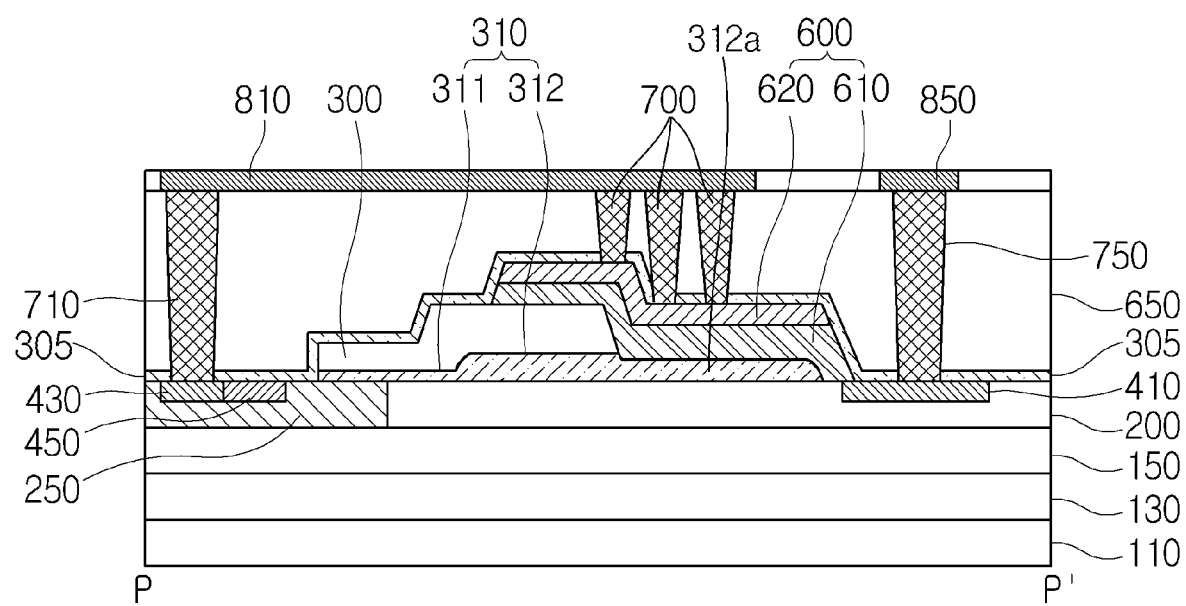
FIG. 11 is a cross-sectional view taken along line P-P' of FIG. 9, according to one or more embodiments.

FIGS. 9 and 10 are plan views showing a semiconductor device according to one or more embodiments of the present disclosure. FIG. 11 is a cross-sectional view taken along line P-P' of FIG. 9.

In an example, as shown in FIG. 9, the field plate plug 700 of a semiconductor device 5 may be provided in the form of a wide stripe on the silicide barrier layer 600 in a top view. That is, each field plate plug 700 may comprise a plurality of segments that extend in a Y-axis direction perpendicular to the channel length direction (X-axis). FIGS. 9 and 11 representatively show an example in which each of the field plate plugs 700 comprises three segments that extend in the Y-axis direction perpendicular to the channel length direction (X-axis). However, an example is not limited to this, and each of the field plate plugs 700 may have a multi-field plate structure composed of three or more segments.

In an example, the segments of the field plate plugs 700 may be, as shown in FIG. 10, connected to corresponding segments of the adjacent field plate plug 700, respectively. In this embodiment, each of the segments of the field plate plug 700 has a shape extending in the form of a quadrangle on the plane.

The widths of the segments in the channel length direction may be the same or different. Also, the widths between adjacent segments in the channel length direction may be the same or different.

Figure 12:
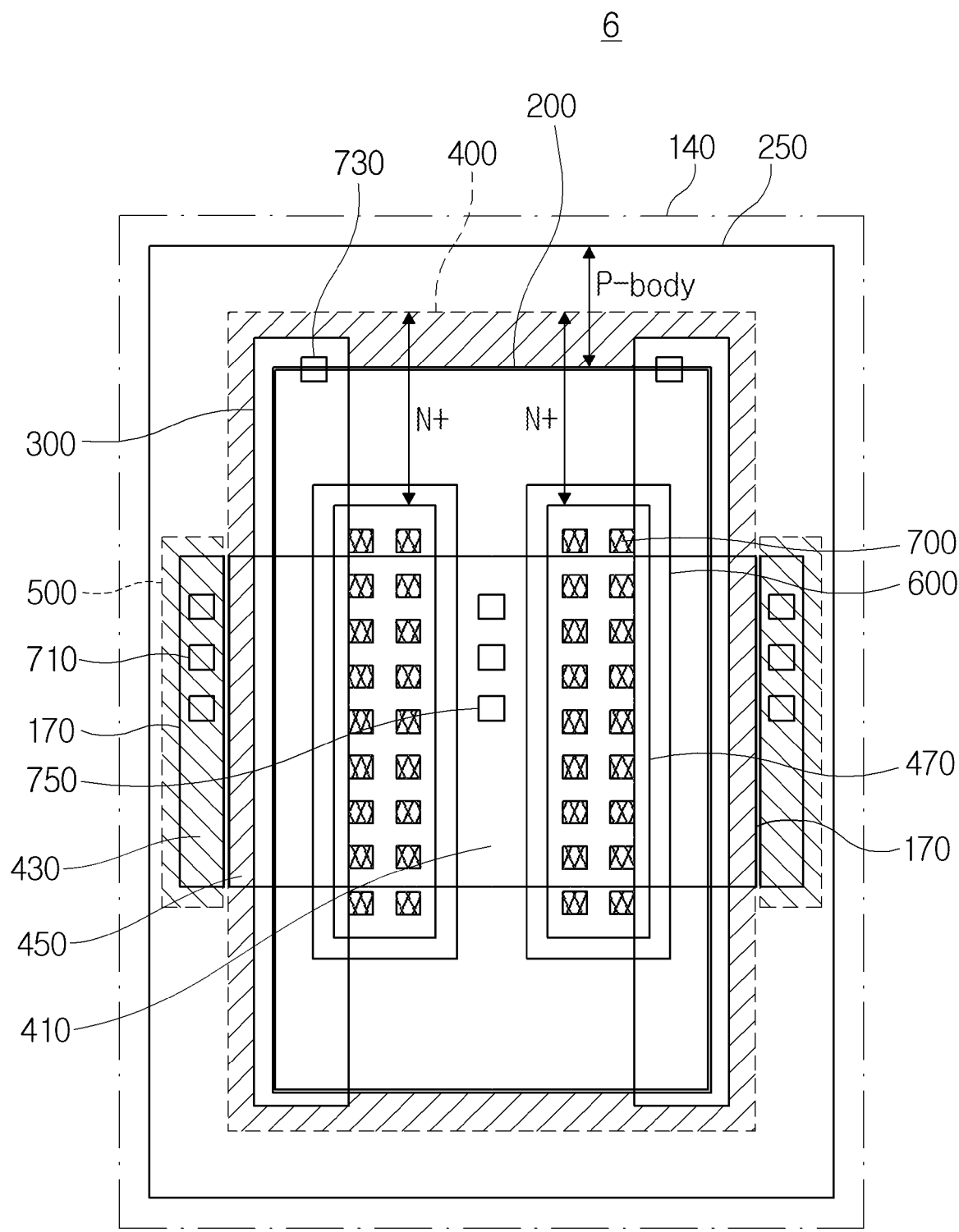
FIG. 12 is a plan view showing a semiconductor device according to one or more embodiments.

FIG. 12 is a plan view showing a semiconductor device according to one or more embodiments of the present disclosure.

In an example, the field plate plug 700 of a semiconductor device 6 may be provided in the form of a hole on the silicide barrier layer 600 in a top view. That is, each field plate plug 700 may comprise a plurality of square segments. In other embodiments, each of the segments of the field plate plug 700 may have various shapes, such as rectangular, circular, elliptical, polygonal shapes, etc., on the plane.

Figure 13:
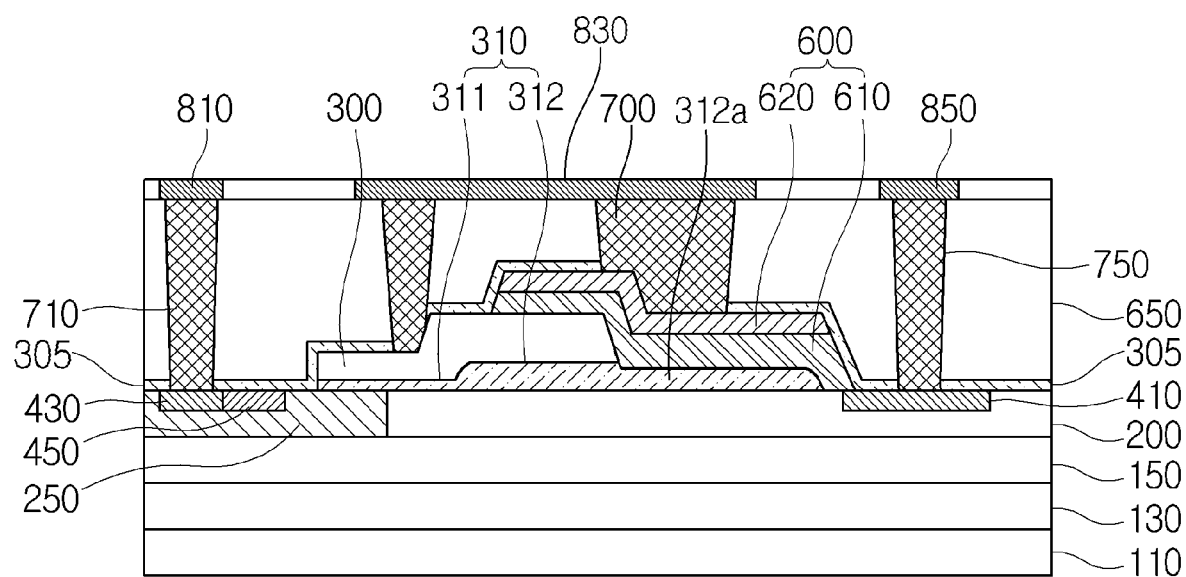
FIG. 13 is a cross-sectional view showing a semiconductor device according to one or more embodiments.

FIG. 13 is a cross-sectional view showing a semiconductor device according to one or more embodiments of the present disclosure. Hereinafter, detailed descriptions of redundant components of the examples of FIGS. 1 to 12 may be omitted.

Referring to FIG. 13, a semiconductor device 7 includes the plurality of contact plugs 710, 730, and 750. The plurality of contact plugs 710, 730, and 750 may be provided to pass through the interlayer insulating layer 650 and the etch stop layer 305. For example, the plurality of contact plugs 710, 730, and 750 may be made of a conductive material. The plurality of contact plugs 710, 730, and 750 may include the source contact plug 710 connected to the first conductive type source region 450, the gate contact plug 730 connected to the gate electrode 300, and the drain contact plug 750 connected to the first conductive type drain region 410. A plurality of the source contact plug 710, a plurality of the gate contact plug 730, and a plurality of the drain contact plug 750 may be provided, respectively.

In an example, the source contact plug 710 may be connected to the first metal wiring 810, the gate contact plug 730 may be connected to the second metal wiring 830, and the drain contact plug 750 may be connected to the third metal wiring 850. In an example, since the field plate plug 700 is in contact with and electrically connected to the second metal wiring 830, the field plate plug 700 may be electrically connected to the gate contact plug 730 and the gate electrode 300. As such, as the field plate plug 700 and the gate electrode 300 are electrically connected to each other, the resistance of an accumulation region formed in the drift region may be reduced.

FIGS. 14a to 14f are views for describing a manufacturing method of the semiconductor device, according to one or more embodiments. For example, the semiconductor device of FIGS. 14a to 14f may correspond to the semiconductor device of FIGS. 1-13.

Figure 14A:
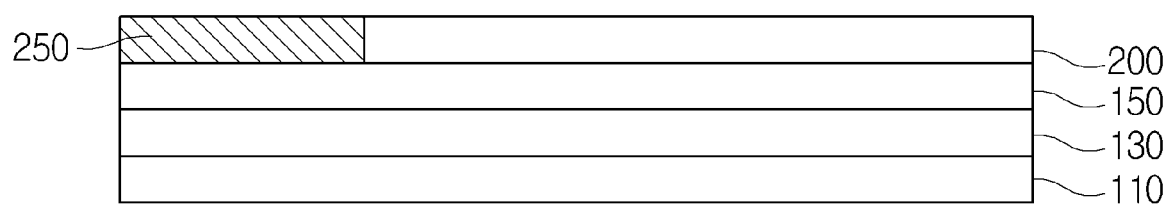
FIGS. 14a to 14f are views for describing a manufacturing method of the semiconductor device according to one or more embodiments.

Referring to FIG. 14a, the first conductive type buried layer 130 and the second conductive type buried layer 150 may be sequentially formed on the substrate 110. The first conductive type buried layer 130 may be formed by implanting N-type impurities, and the second conductive type buried layer 150 may be formed by implanting P-type impurities. The first conductive type drift region 200 may be formed on the second conductive type buried layer 150. The first conductive type drift region 200 may be formed by implanting N-type impurities into the active region formed on the second conductive type buried layer 150. Also, the second conductive type body region 250 may be formed on the second conductive type buried layer 150. The second conductive type body region 250 may be formed by implanting P-type impurities into the active region. In an example, the second conductive type body region 250 may be doped with low concentration P-type impurities.

Figure 14B:
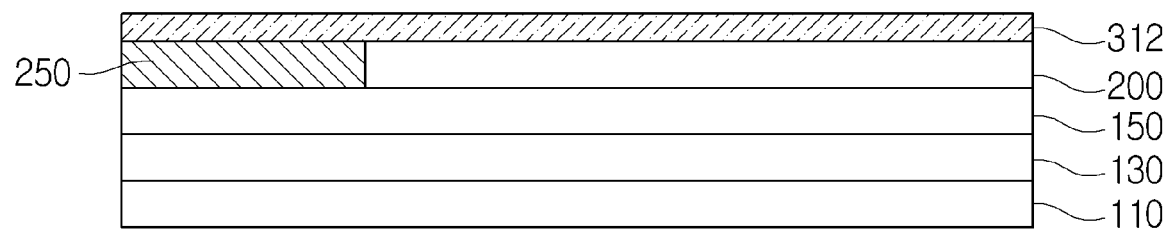

Referring to FIG. 14b, a CVD oxide film 312 as a thick gate insulating layer is deposited on the first conductive type drift region 200 and the second conductive type body region 250. The CVD oxide film 312 may be formed to have a thickness of about 20 nm to 40 nm at about 600° C. to 750° C.

Figure 14C:
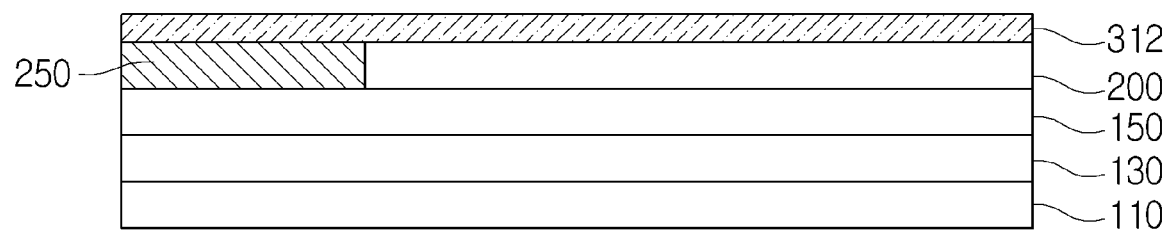

Subsequently, as shown in FIG. 14c, the deposited CVD oxide film 312 on the remaining regions other than a portion of the top of the first conductive type drift region 200 is etched through a photolithography process. Then, the remaining portion of the first conductive type drift region 200, which is not covered by the CVD oxide film 312, and the second conductive type body region 250 are exposed upward. Here, the CVD oxide film 312 may be etched by a wet etching method. After the wet etching process, the etched end of the CVD oxide film 312 may be curved to have a gentle slope. The CVD oxide film 312, which remains after the photolithography process, may constitute the second gate insulating layer 312 of the gate insulating layer 310.

Figure 14D:
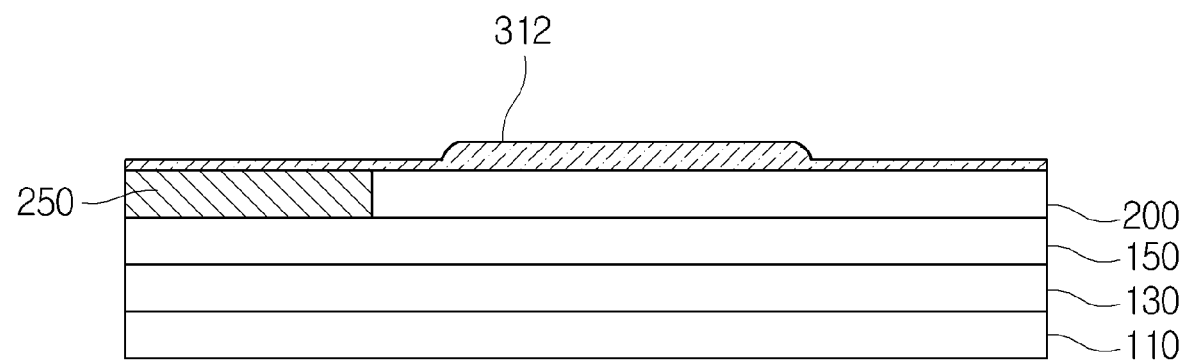

Next, as shown in FIG. 14d, a thin gate oxide layer 311 as a thin gate insulating layer is thermally grown on the first conductive type drift region 200 and the second conductive type body region 250. The thin gate oxide layer 311 may be formed to have a thickness of about 6 nm to 30 nm at about 700° C. to 1000° C. The thin and thick gate insulating layers 311 and 312 are belong to a gate insulating layer 310.

Figure 14E:
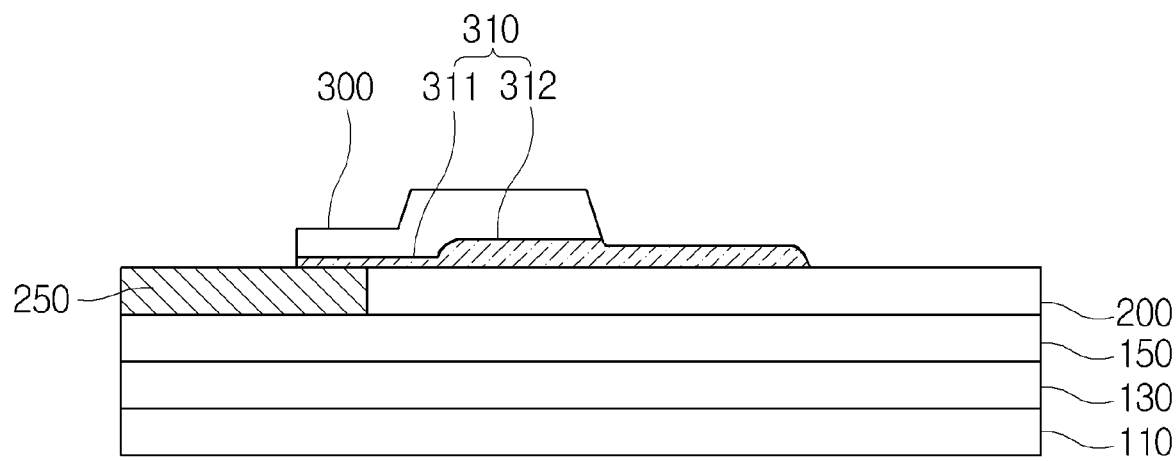

Then, as shown in FIG. 14e, the gate electrode 300 may be formed on the gate insulating layer 310. The gate electrode 300 may be disposed on an upper portion of the first gate insulating layer 311 and at least one region of the second gate insulating layer 312 of the gate insulating films 310. Here, due to a difference in thickness between the first gate insulating layer 311 and the second gate insulating layer 312, the gate electrode 300 has a level difference in the vicinity of a boundary between the first gate insulating layer 311 and the second gate insulating layer 312. In a region in which the gate electrode 300 is not disposed, a region of the second gate insulating layer 312 of the gate insulating layer 310 is exposed upward.

Figure 14F:
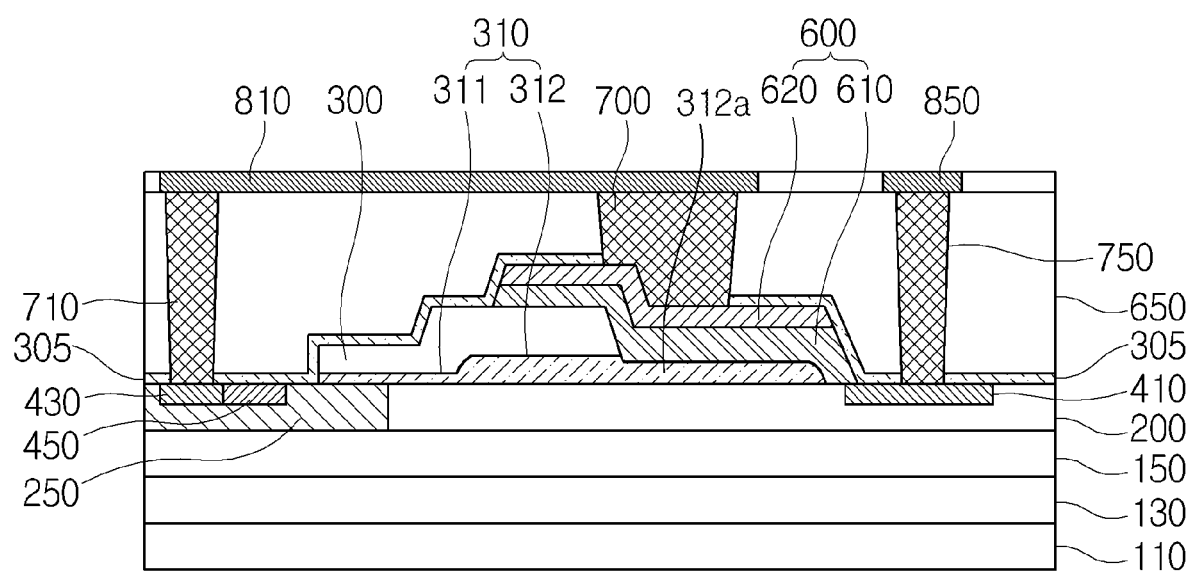

Subsequently, as shown in FIG. 14f, the first conductive type drain region 410 may be formed in the first conductive type drift region 200, and the first conductive type source region 450 and the second conductive type pickup region 430 may be formed in the second conductive type body region 250. The first conductive type drain region 410 and the first conductive type source region 450 may be formed by implanting N-type impurities, and the second conductive type pickup region 430 may be formed by implantation P-type impurity. The second conductive type pickup region 430 may be doped with higher doping concentration P-type impurities than the second conductive type body region 250.

Also, the silicide barrier layer 600 may be formed on a portion of the first conductive type drift region 200, a portion of the gate electrode 300, and the second gate insulating layer 312a of the gates insulating layer 310, which is not covered by the gate electrode 300. The silicide barrier layer 600 may be formed from the gate electrode 300 to the top of the first conductive type drift region 200. The silicide barrier layer 600 may cover a portion of the top surface of the gate electrode 300. The silicide barrier layer 600 is a barrier insulating layer that prevents the formation of silicide. When the silicide barrier layer 600 is formed on the gate electrode 300 or the top surface of the substrate, no silicide layer is formed.

Then, the etch stop layer 305 may be formed on the first conductive type source region 450, the gate electrode 300, the silicide barrier layer 600, and the first conductive type drain region 410. Also, the interlayer insulating layer 650 which covers the etch stop layer 305 may be formed.

Then, contact holes passing through the interlayer insulating layer 650 may be formed. A dry etching process may form the plurality of contact holes. The plurality of contact holes may include a source contact hole which exposes the first conductive type source region 450, a gate contact hole which exposes the top surface of the gate electrode 300, a drain contact hole that exposes the first conductive type drain region 410, and a field plate contact hole which exposes the top surface of the silicide barrier layer 600. The width of the field plate contact hole may be greater than the width of the source contact hole, the width of the gate contact hole or the width of the drain contact hole.

The contact holes may then be filled with a conductive material, forming the source contact plug 710, the gate contact plug (see reference numeral 730 in FIG. 1), the drain contact plug 750, and the field plate plug 700.

Then, the first metal wiring 810 which connects the source contact plug 710 and the field plate plug 700 may be formed, and the third metal wiring 850 which is connected to the drain contact plug 750 may be formed. Although not shown in the drawings, the second metal wiring (see reference numeral 830 in FIG. 13) which is connected to the gate contact plug (see reference numeral 730 of FIG. 1) may be formed. Therefore, the first conductive type source region 450 may be electrically connected to the first metal wiring 810 to receive a source voltage applied to the first metal wiring 810. The first conductive type drain region 410 may be electrically connected to the third metal wiring 850 to receive a drain voltage applied to the third metal wiring 850. Although not shown in the drawings, the gate electrode 300 may be electrically connected to the second metal wiring (see reference numeral 830 in FIG. 13) to receive a gate voltage applied to the second metal wiring (see reference numeral 830 in FIG. 13). Also, a ground voltage is applied to the field plate plug 700 through the first metal wiring 810.

According to the semiconductor device and the manufacturing method thereof, it is possible to reduce an on-resistance of LDMOS and to reduce a parasitic capacitance between the gate and the drain. The LDMOS may be used in various power devices, including a display driver IC, a power converter, a motor controller, and a power source device for a vehicle According to the semiconductor device and the manufacturing method thereof, a high-efficiency semiconductor device is provided without adding complicated processes, so that it is possible to reduce the process difficulty, to prevent the price increase, and to produce products having various structures suitable for the purpose of use of customers for a short period of time.

According to the semiconductor device and the manufacturing method thereof, it is possible to provide a bipolar-CMOS-DMOS (BCD) process optimized for the semiconductor device having a high switching speed, to reduce the chip size of a power management product which uses the BCD process, and to improve the efficiency of a power block.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor device, comprising:
a drain region and a source region disposed on a substrate;
a gate insulating layer disposed between the drain region and the source region and comprising:
   a first gate insulating layer having a first thickness; and
   a second gate insulating layer having a second thickness greater than the first thickness and a third thickness greater than the first thickness but less than the second thickness, wherein the first and second gate insulating layers are made of a same material and a bottom surface of the first gate insulating layer and a bottom surface of the second gate insulating layer having the third thickness are parallel to each other;
a gate electrode disposed on the first gate insulating layer and the second gate insulating layer having the second thickness;
a silicide barrier layer disposed in contact with a top surface of the second gate insulating layer having the third thickness and a top surface of the gate electrode;
a source contact plug connected to the source region;
a drain contact plug connected to the drain region;
an etch stop layer disposed on the source region, the gate electrode, the silicide barrier layer and the drain region; and
a field plate plug disposed in contact with the silicide barrier layer, wherein the second gate insulating layer in direct contact with the silicide barrier layer is spaced apart from the drain region by the silicide barrier layer disposed between the second gate insulating layer and the drain region,
wherein the second gate insulating layer having the second thickness is disposed below the gate electrode, and
wherein the second gate insulating layer having the third thickness overlaps the silicide barrier layer, the etch stop layer and the field plate plug.

2. The semiconductor device of claim 1, wherein the second gate insulating layer is disposed closer to the drain region than the first gate insulating layer, and
wherein the second gate insulating layer comprises a first portion overlapping the gate electrode and a second portion overlapping the silicide barrier layer.

3. The semiconductor device of claim 1, wherein the silicide barrier layer comprises a first sub-silicide barrier layer and a second sub-silicide barrier layer made of different materials.

4. The semiconductor device of claim 1, further comprising:
an interlayer insulating layer disposed on the etch stop layer; and
a metal wiring disposed on the interlayer insulating layer,
wherein the second gate insulating layer having the third thickness, the silicide barrier layer, and the field plate plug are disposed between a drift region and the metal wiring.

5. The semiconductor device of claim 4, wherein the field plate plug passes through the etch stop layer and the interlayer insulating layer.

6. The semiconductor device of claim 1, wherein the field plate plug is disposed to vertically overlap or to be vertically spaced apart from the gate electrode.

7. The semiconductor device of claim 1, wherein the drain region is disposed to overlap the silicide barrier layer.

8. The semiconductor device of claim 1, further comprising:
a first metal wiring connected to the source contact plug;
a second metal wiring connected to the gate electrode; and
a third metal wiring connected to the drain contact plug,
wherein the field plate plug is connected to the source region or the gate electrode through the first metal wiring or the second metal wiring.

9. The semiconductor device of claim 1, further comprising:
a first conductive type buried layer disposed on the substrate;
a second conductive type buried layer disposed on the first conductive type buried layer; and
a first conductive type drift region and a second conductive type body region disposed on the second conductive type buried layer.

10. A semiconductor device, comprising:
a gate insulating layer comprising a first gate insulating layer having a first thickness, and a second gate insulating layer having a second thickness greater than the first thickness and a third thickness greater than the first thickness but less than the second thickness, wherein a bottom surface of the first gate insulating layer and a bottom surface of the second gate insulating layer having the third thickness are parallel to each other;
a first gate electrode and a second gate electrode disposed to be spaced apart from each other on a substrate, wherein each of the first and second gate electrodes is disposed on the first gate insulating layer and the second gate insulating layer having the second thickness;
a first silicide barrier layer disposed in contact with a top surface of the second gate insulating layer having the third thickness and a top surface of the first gate electrode;
a second silicide barrier layer disposed to overlap the second gate electrode;
a drain region disposed between the first and second silicide barrier layers;
a first source region disposed on one side of the first gate electrode;
a second source region disposed on one side of the second gate electrode;
a body region disposed to surround the first and second gate electrodes;
a drift region disposed in contact with the body region; and
a first field plate plug and a second field plate plug disposed to directly contact upper surfaces of the first and second silicide barrier layers, respectively, and abutting an etch stop layer,
wherein the etch stop layer is disposed on the first and second source regions, the first and second gate electrodes, the first and second silicide barrier layers and the drain region,
wherein the first and second gate insulating layers are made of a same material, and
wherein the second gate insulating layer having the third thickness overlaps the first and second silicide barrier layers, the etch stop layer, and the first and second field plate plugs.

11. The semiconductor device of claim 10, wherein the second gate insulating layer having the third thickness, the first silicide barrier layer, and the first field plate plug are disposed on the drift region,
wherein the first silicide barrier layer is disposed to completely surround the first field plate plug, and
wherein the drift region is disposed to completely surround the first and second silicide barrier layers.

12. The semiconductor device of claim 10, further comprising:
a first pickup region and a second pickup region disposed in the body region; and
a deep well region disposed to surround the body region and the drift region.

13. The semiconductor device of claim 10, further comprising a first conductive type ion doped region disposed to overlap the first and second silicide barrier layers.

14. The semiconductor device of claim 10, wherein a total area of the first silicide barrier layer not overlapping the first gate electrode is greater than a total area of the first silicide barrier layer overlapping the first gate electrode.

15. The semiconductor device of claim 10, wherein the first gate electrode is disposed to overlap the drift region, the body region, and the first silicide barrier layer.

16. The semiconductor device of claim 10, wherein the first and second field plate plugs on the first and second silicide barrier layers are arranged to have a flat plate shape, a stripe shape composed of two or more segments extending perpendicular to a channel length direction, a circular shape, an elliptical shape, or a polygonal shape.

17. A semiconductor device, comprising:
a drain region and a source region disposed on a substrate;
a gate insulating layer, disposed on the substrate between the drain region and the source region, comprising a first gate insulating layer having a first thickness, and a second gate insulating layer having a second thickness greater than the first thickness and a third thickness greater than the first thickness but less than the second thickness, wherein a bottom surface of the first gate insulating layer and a bottom surface of the second gate insulating layer having the third thickness are parallel to each other;
a gate electrode disposed on the first gate insulating layer and the second gate insulating layer having the second thickness;
a silicide barrier layer disposed in contact with a top surface of the gate electrode and a top surface of the second gate insulating layer having the third thickness; and a field plate plug disposed on the silicide barrier layer to overlap the second gate insulating layer having the third thickness and abutting an etch stop layer, wherein the etch stop layer is disposed on the source region, the gate electrode, the silicide barrier layer and the drain region, wherein the second gate insulating layer in direct contact with the silicide barrier layer is spaced apart from the drain region by the silicide barrier layer disposed between the second gate insulating layer and the drain region, wherein the second gate insulating layer having the second thickness is disposed below the gate electrode, and the second gate insulating layer having the third thickness is disposed below the silicide barrier layer, respectively, wherein the second gate insulating layer having the third thickness overlaps the silicide barrier layer, the etch stop layer and the field plate plug, and wherein the first and second gate insulating layers are made of a same material.

18. The semiconductor device of claim 17, wherein the field plate plug further overlaps the gate electrode disposed on the second gate insulating layer.

19. The semiconductor device of claim 17, wherein the field plate plug is vertically unaligned with the gate electrode.

20. The semiconductor device of claim 17, wherein the field plate plug comprises a first field plate plug and a second field plate plug, the first field plate plug overlaps the gate electrode, and the second field plate plug is vertically unaligned with the gate electrode.

* * * * *